(12) United States Patent
Singleton et al.

(10) Patent No.: US 7,888,947 B2
(45) Date of Patent: Feb. 15, 2011

(54) CALIBRATING AUTOMATIC TEST EQUIPMENT

(75) Inventors: Rodney Singleton, Boston, MA (US); Senay Abbay, North Andover, MA (US); Daniel Busuioc, Boston, MA (US)

(73) Assignee: Teradyne, Inc., North Reading, MA (US)

( * ) Notice: Subject to any disclaimer, the term of this patent is extended or adjusted under 35 U.S.C. 154(b) by 455 days.

(21) Appl. No.: 11/943,948

(22) Filed: Nov. 21, 2007

(65) Prior Publication Data

US 2009/0128162 A1    May 21, 2009

(51) Int. Cl.
*H01H 31/02* (2006.01)
*G01R 35/00* (2006.01)
*G01R 31/28* (2006.01)

(52) U.S. Cl. .................. 324/555; 324/158.1; 324/601; 714/724

(58) Field of Classification Search .................. 324/555
See application file for complete search history.

(56) References Cited

U.S. PATENT DOCUMENTS

| | | | |
|---|---|---|---|
| 5,490,090 A | 2/1996 | Ellis | |
| 5,581,177 A | 12/1996 | Hussey et al. | |
| 5,905,577 A | 5/1999 | Wilsher et al. | |
| 5,929,628 A * | 7/1999 | Becker et al. | 324/158.1 |
| 5,949,798 A | 9/1999 | Sakaguchi | |
| 6,504,395 B1 * | 1/2003 | Johnson | 324/765 |
| 6,859,031 B2 | 2/2005 | Pakdaman | |
| 7,035,750 B2 | 4/2006 | Obaldla et al. | |
| 7,098,646 B2 | 8/2006 | Rose | |
| 7,290,189 B2 * | 10/2007 | Zhou et al. | 714/724 |
| 7,480,581 B2 * | 1/2009 | Lew et al. | 702/107 |
| 2003/0146761 A1 | 8/2003 | Pakdaman | |
| 2003/0234693 A1 | 12/2003 | Staszewski et al. | |
| 2003/0235262 A1 | 12/2003 | Staszewski et al. | |
| 2004/0146098 A1 | 7/2004 | Eliezer et al. | |
| 2004/0146132 A1 | 7/2004 | Staszewski et al. | |
| 2004/0148121 A1 | 7/2004 | Obaldia et al. | |
| 2004/0148580 A1 | 7/2004 | Obaldia et al. | |
| 2004/0151257 A1 | 8/2004 | Staszewski et al. | |
| 2005/0174234 A1 | 8/2005 | Rose | |
| 2005/0193355 A1 * | 9/2005 | Hildebrant et al. | 716/6 |
| 2005/0212606 A1 | 9/2005 | Staszewski et al. | |
| 2005/0240790 A1 | 10/2005 | Nadeau-Dostie et al. | |
| 2005/0240847 A1 | 10/2005 | Nadeau-Dostie et al. | |

(Continued)

FOREIGN PATENT DOCUMENTS

DE    4423186    1/1995

(Continued)

OTHER PUBLICATIONS

Novelty Search Report dated Sep. 27, 2006, 5 pages.

(Continued)

*Primary Examiner*—Jeff Natalini
(74) *Attorney, Agent, or Firm*—Fish & Richardson P.C.

(57) ABSTRACT

A method for use with automatic test equipment (ATE) includes programming the ATE to generate bursts, each of which corresponds to a signal characteristic produced by the ATE, obtaining power levels for the bursts, and determining if the power levels for the bursts correspond to expected power levels for signal characteristics corresponding to the bursts.

19 Claims, 7 Drawing Sheets

U.S. PATENT DOCUMENTS

2005/0264297 A1* 12/2005 Gorka .................. 324/525
2006/0071652 A1*  4/2006 Miura ................. 324/76.11
2006/0224343 A1* 10/2006 Visser et al. ............. 702/85

FOREIGN PATENT DOCUMENTS

| EP | 0864872 | 9/1998 |
| EP | 1470431 | 8/2003 |
| EP | 1443653 | 8/2004 |
| EP | 1476765 | 4/2006 |
| FR | 2712987 | 2/1995 |
| FR | 2716976 | 9/1995 |
| GB | 2280963 | 2/1995 |
| GB | 2310290 | 8/1997 |
| WO | WO03071296 | 2/2003 |
| WO | WO03067271 | 8/2003 |

OTHER PUBLICATIONS

Agilent N4691B Electronic Calibration Modules for Vector Network Analyzers [online] Retrieved from the Internet:http://cp.literature.agilent.com/litweb/pdf/5963-3743E.pdf [retrieved on Sep. 27, 2010].

Agilent N5531S Measuring Receiver Data Sheet [online] Retrieved from the Internet:< http://cp.literature.agilent.com/litweb/pdf/5989-9217EN.pdf> [retrieved on Sep. 27, 2010].

Agilent E5052A Signal Source Analyzer Application [online] Retrieved from the Internet:< http://cp.literature.agilent.com/litweb/pdf/5989-1617EN.pdf> [retrieved on Sep. 27, 2010].

Agilent 33250A Function / Arbitrary Waveform Generator [online] Retrieved from the Internet:< http://cp.literature.agilent.com/litweb/pdf/5968-8807EN.pdf> [retrieved on Sep. 27, 2010].

Agilent E8257D PSG Microwave Analog Signal Generator [online] Retrieved from the Internet:< http://cp.literature.agilent.com/litweb/pdf/5989-0698EN.pdf> [retrieved on Sep. 27, 2010].

* cited by examiner

CALIBRATING AUTOMATIC TEST EQUIPMENT

TECHNICAL FIELD

This patent application relates generally to calibrating automatic test equipment.

BACKGROUND

ATE refers to an automated, usually computer-driven, systems for testing devices, such as semiconductors, electronic circuits, and printed circuit board assemblies. A device tested by ATE is referred to as a device under test (DUT).

ATE typically includes a computer system and a testing device or a single device having corresponding functionality. ATE is capable of providing signals to a DUT via its source channel. A capture channel receives signals from the DUT and forwards those signals for processing to determine whether the DUT meets testing qualifications.

During manufacture or at a use site, ATE may be tested in order to determine whether its operation is acceptable. This is known as performance verification.

SUMMARY

This patent application describes methods and apparatus, including computer program products, for calibrating automatic test equipment, e.g., during performance verification.

In general, this patent application describes a method for use with automatic test equipment (ATE), which comprises programming the ATE to generate bursts, each of which corresponds to a signal characteristic produced by the ATE, obtaining power levels for the bursts, and determining if the power levels for the bursts correspond to expected power levels for signal characteristics corresponding to the bursts. The method may also include one or more of the following features, either alone or in combination.

Each of the bursts may correspond to a different signal characteristic produced by the ATE. Programming the ATE may comprise receiving data identifying signal characteristics and using the data to cause the ATE to generate the bursts, e.g., by adjusting programmable settings (PSETS) on the ATE. Obtaining a power level for a subject burst may comprise waiting for the subject burst to substantially settle, and obtaining a power level of the subject burst after the subject burst substantially settles.

The method may further comprise calibrating the ATE based on a determination of whether one or more of the power levels corresponds to one or more expected power levels. Calibrating the ATE may comprise adjusting circuitry in the ATE that is configured to produce one or more bursts corresponding to the one or more power levels.

The bursts may comprise a progression of bursts that occur one burst after another burst. The signal characteristic may comprise at least one of signal frequency and signal amplitude.

In general, this patent application also describes a system comprising automatic test equipment (ATE) that is configured to generate bursts, each of which corresponds to a signal characteristic that is producible by the ATE, a sensor configured to obtain power levels for the bursts, and a processing device configured to determine if the power levels for the bursts correspond to expected power levels for signal characteristics corresponding to the bursts. The system may also include one or more of the following features, either alone or in combination.

Each of the bursts may correspond to a different signal characteristic produced by the ATE. The ATE may be configured to receive data identifying signal characteristics and to use the data to cause the ATE to generate the bursts. Using the data may comprise adjusting programmable settings (PSETS) on the ATE. The processing device may comprise a computer. The ATE may comprise a signal generator configured to generate the bursts based on the data. Obtaining a power level for a subject burst may comprise waiting for the subject burst to substantially settle and obtaining an average power level of the subject burst after the subject burst substantially settles.

The bursts may comprise a progression of bursts that occur one burst after another burst. The signal characteristic may comprise at least one of signal frequency and signal amplitude.

In general, this patent application also describes a system comprising signal generation circuitry configured to provide information to a device, where the information corresponds to signal characteristics, and where the device is configured to receive the information and to generate bursts based on the information. The system also comprises a sensor configured to obtain power levels for the bursts, and a processing device configured to determine if the power levels for the bursts correspond to expected power levels for signal characteristics corresponding to the bursts. The system may also include one or more of the following features, either alone or in combination.

The signal generation circuitry may comprise a waveform generator configured to generate pulses and a synthesizer to affect the pulses so that the pulses convey the information to the device. The information may comprise at least one of signal frequency and signal amplitude.

All or part of the foregoing methods and systems may be implemented as a computer program product comprised of instructions that are stored on one or more machine-readable media, and that are executable on one or more processing devices. All or part of the foregoing methods and systems may be implemented as an apparatus or system that includes one or more processing devices and memory to store executable instructions to implement one or more processes.

Any two or more of the foregoing features may be combined to form other implementations not specifically set forth in combination.

The details of one or more examples are set forth in the accompanying drawings and the description below. Further features, aspects, and advantages of the invention will become apparent from the description, the drawings, and the claims.

DETAILED DESCRIPTION

Figure 1:
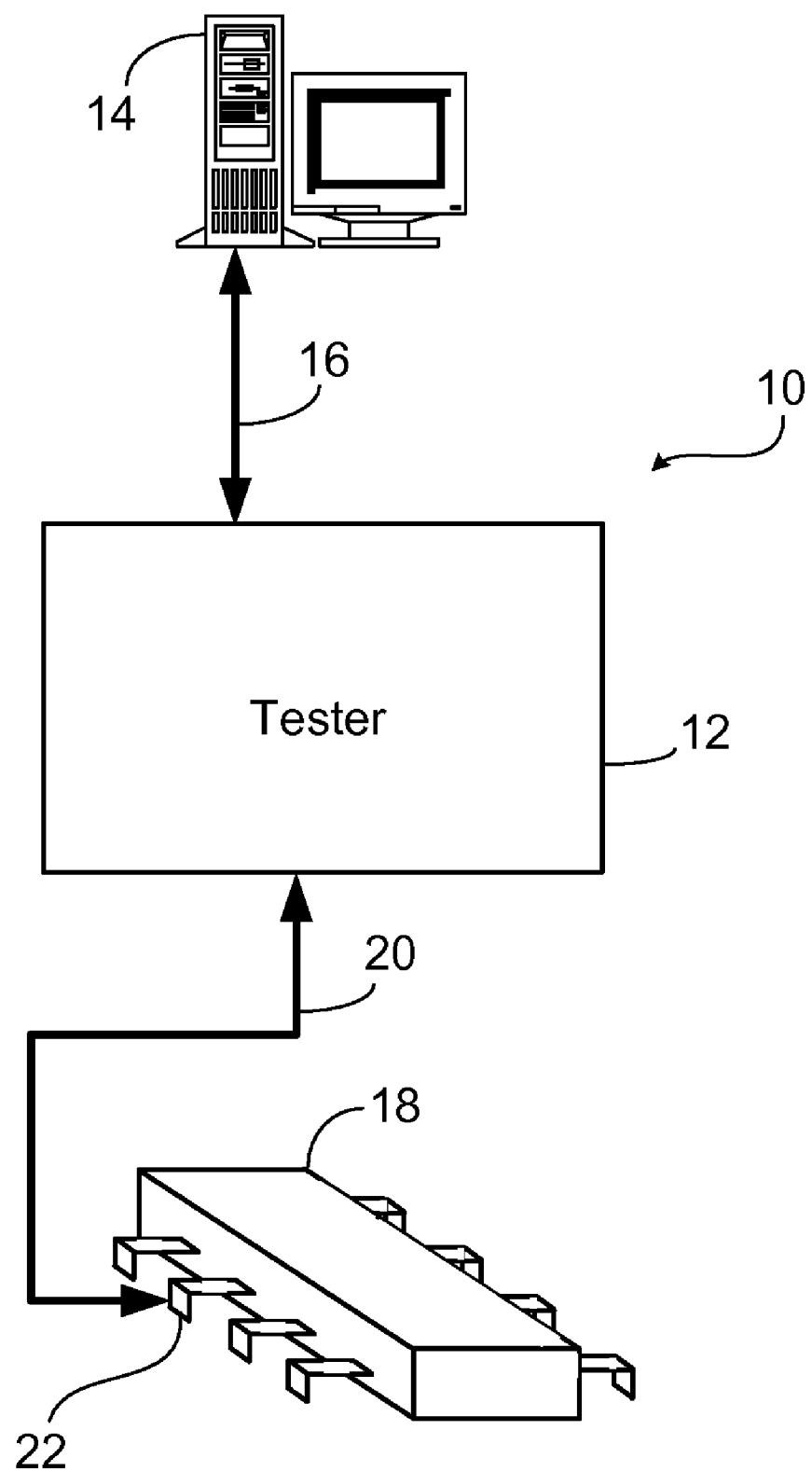
FIG. 1 is a block diagram of ATE for testing devices.

Referring to FIG. 1, an ATE system 10 for testing a device-under-test (DUT) 18, such as a semiconductor device, includes a tester 12. To control tester 12, system 10 includes a computer system 14 that interfaces with tester 12 over a hardwire connection 16. Typically, computer system 14 sends commands to tester 12 to initiate execution of routines and functions for testing DUT 18. Such executing test routines may initiate the generation and transmission of test signals to the DUT 18 and collect responses from the DUT. Various types of DUTs may be tested by system 10. For example, DUTs may be semiconductor devices such as an integrated circuit (IC) chip (e.g., memory chip, microprocessor, analog-to-digital converter, digital-to-analog converter, etc.).

To provide test signals and collect responses from the DUT, tester 12 is connected to one or more connector pins that provide an interface for the internal circuitry of DUT 18. To test some DUTs, e.g., as many as sixty-four or one hundred twenty-eight connector pins (or more) may be interfaced to tester 12. For illustrative purposes, in this example, semiconductor device tester 12 is connected to one connector pin of DUT 18 via a hardwire connection. A conductor 20 (e.g., cable) is connected to pin 22 and is used to deliver test signals (e.g., PMU test signals, PE test signals, etc.) to the internal circuitry of DUT 18. Conductor 20 also senses signals at pin 22 in response to the test signals provided by semiconductor device tester 12. For example, a voltage signal or a current signal may be sensed at pin 22 in response to a test signal and sent over conductor 20 to tester 12 for analysis. Such single port tests may also be performed on other pins included in DUT 18. For example, tester 12 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 20 to pin 22 for storing a digital value on DUT 18. Once stored, DUT 18 may be accessed to retrieve and send the stored digital value over conductor 20 to tester 12. The retrieved digital value may then be identified to determine if the proper value was stored on DUT 18.

Along with performing one-port measurements, a two-port test may also be performed by semiconductor device tester 12. For example, a test signal may be injected over conductor 20 into pin 22 and a response signal may be collected from one or more other pins of DUT 18. This response signal is provided to semiconductor device tester 12 to determine quantities, such as gain response, phase response, and other throughput measurement quantities.

Figure 2:
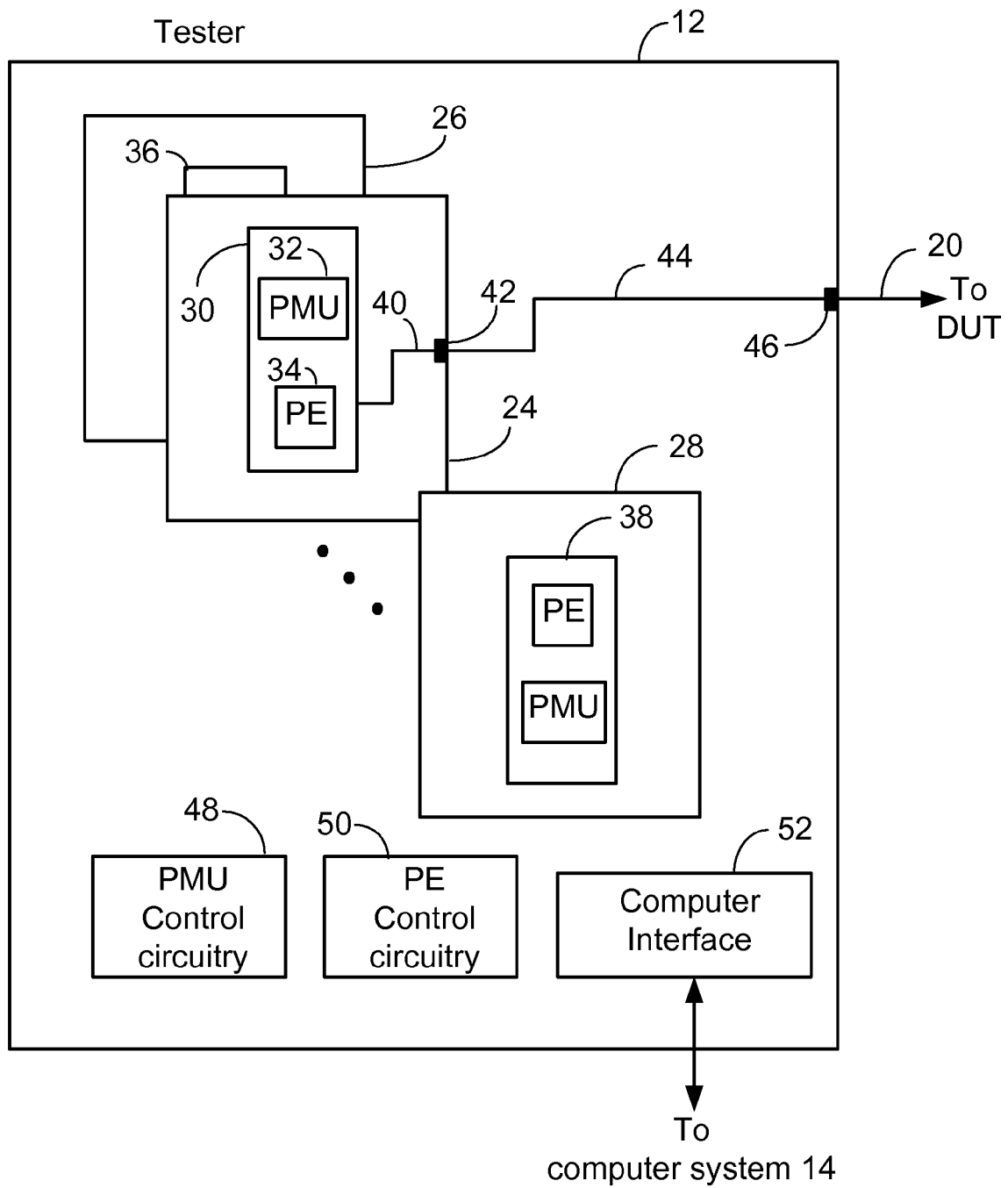
FIG. 2 is a block diagram of a tester used in the ATE.

Referring also to FIG. 2, to send and collect test signals from multiple connector pins of a DUT (or multiple DUTs), semiconductor device tester 12 includes an interface card 24 that can communicate with numerous pins. For example, interface card 24 may transmit test signals to, e.g., 32, 64, or 128 pins and collect corresponding responses. Each communication link to a pin is typically referred to as a channel and, by providing test signals to a large number of channels, testing time is reduced since multiple tests may be performed simultaneously. Along with having many channels on an interface card, by including multiple interface cards in tester 12, the overall number of channels increases, thereby further reducing testing time. In this example, two additional interface cards 26 and 28 are shown to demonstrate that multiple interface cards may populate tester 12.

Each interface card includes a dedicated integrated circuit (IC) chip (e.g., an application specific integrated circuit (ASIC)) for performing particular test functions. For example, interface card 24 includes IC chip 30 for performing parametric measurement unit (PMU) tests and pin electronics (PE) tests. IC chip 30 has a PMU stage 32 that includes circuitry for performing PMU tests and a PE stage 34 that includes circuitry for performing PE tests. Additionally, interface cards 26 and 28 respectively include IC chips 36 and 38 that include PMU and PE circuitry. Typically PMU testing involves providing a DC voltage or current signal to the DUT to determine such quantities as input and output impedance, current leakage, and other types of DC performance characterizations. PE testing involves sending AC test signals, or waveforms, to a DUT (e.g., DUT 18) and collecting responses to further characterize the performance of the DUT. For example, IC chip 30 may transmit (to the DUT) AC test signals that represent a vector of binary values for storage on the DUT. Once these binary values have been stored, the DUT may be accessed by tester 12 to determine if the correct binary values have been stored. Since digital signals typically include abrupt voltage transitions, the circuitry in PE stage 34 on IC chip 30 operates at a relatively high speed in comparison to the circuitry in PMU stage 32.

To pass both DC and AC test signals from interface card 24 to DUT 18, a conducting trace 40 connects IC chip 30 to an interface board connector 42 that allows signals to be passed on and off interface board 24. Interface board connector 42 is also connected to a conductor 44 that is connected to an interface connector 46, which allows signals to be passed to and from tester 12. In this example, conductor 20 is connected to interface connector 46 for bi-directional signal passage between tester 12 and pin 22 of DUT 18. In some arrangements, an interface device may be used to connect one or more conductors from tester 12 to the DUT. For example, the DUT (e.g., DUT 18) may be mounted onto a device interface board (DIB) for providing access to each DUT pin. In such an arrangement, conductor 20 may be connected to the DIB for placing test signals on the appropriate pin(s) (e.g., pin 22) of the DUT.

In this example, only conducting trace 40 and conductor 44 respectively connect IC chip 30 and interface board 24 for delivering and collecting signals. However, IC chip 30 (along with IC chips 36 and 38) typically has multiple pins (e.g., eight, sixteen, etc.) that are respectively connected with multiple conducting traces and corresponding conductors for providing and collecting signals from the DUT (via a DIB). Additionally, in some arrangements, tester 12 may connect to two or more DIB's for interfacing the channels provided by interface cards 24, 26, and 28 to one or multiple devices under test.

To initiate and control the testing performed by interface cards 24, 26, and 28, tester 12 includes PMU control circuitry 48 and PE control circuitry 50 that provide test parameters (e.g., test signal voltage level, test signal current level, digital values, etc.) for producing test signals and analyzing DUT responses. The PMU control circuitry and PE control circuitry may be implemented using one or more processing devices. Examples of processing devices include, but are not limited to, a microprocessor, a microcontroller, programmable logic (e.g., a field-programmable gate array), and/or combination(s) thereof. Tester 12 also includes a computer interface 52 that allows computer system 14 to control the operations executed by tester 12 and also allows data (e.g., test parameters, DUT responses, etc.) to pass between tester 12 and computer system 14.

Figure 3:
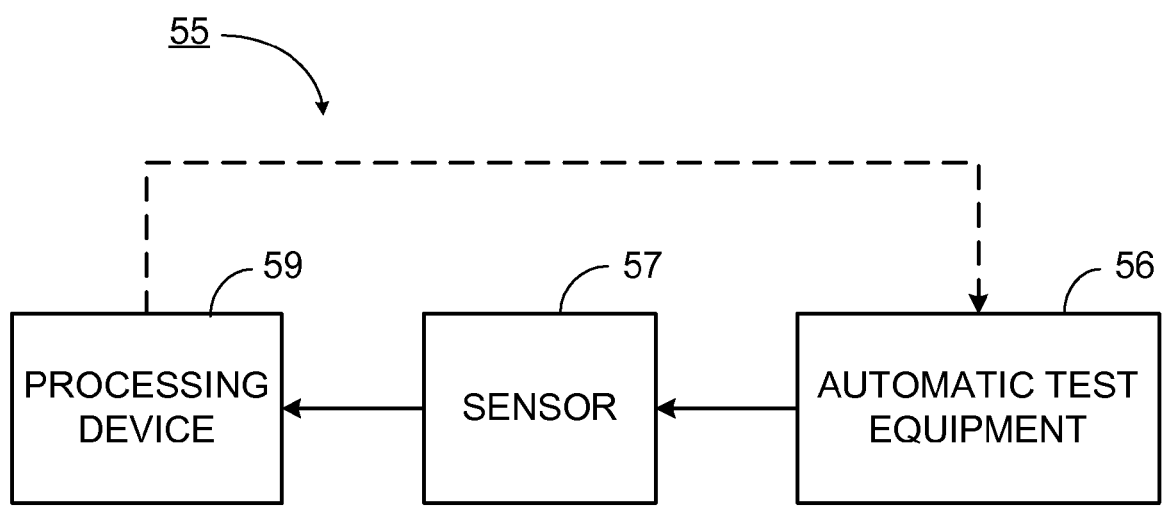
FIG. 3 is a block diagram showing a configuration for calibrating automatic test equipment during a performance verification process.

One example of a system 55 for calibrating ATE 56 is shown in FIG. 3. ATE 56 may be the ATE of FIGS. 1 and 2 or any other type of ATE or other test equipment. In one implementation, ATE 56 is programmable to generate signal bursts at specified frequencies. For example, ATE 56 may be programmed using programmable settings, or PSETS. The programmable settings may be input directly to the ATE or via a computer or other processing device that is communicatively coupled to the ATE. By way of example, programmable settings may be input, which cause the ATE to generate bursts at, e.g., 1 gigahertz (GHz), 1 GH plus 1 megahertz (MHz), 1 GHz plus 2 MHz, and so on. Other increments may be used in addition to, or instead of, these.

System 55 also includes a sensor 57 that is configured to obtain power levels for the bursts generated by the ATE. One example of a sensor that may be used in system 55 is the Rohle & Schwarz NRP-Z11 Triple Diode Power Sensor. Other types of sensors may be used instead of, or in addition to, this sensor. A sensor, in this context, may include any type of spectrum analyzer or other peak-power-capable instrument that is configured to obtain power levels. Sensor 57 typically waits for the bursts to settle, and then measures the power levels of the bursts. For example, sensor 57 may wait a predetermined amount of time following each burst or it may track bursts and make a power measurement once the burst settles to within a predetermined tolerance.

System 55 also includes a processing device 59. Processing device 59 may be any type of device that is capable of receiving an input and of executing instructions to produce an output based on the input. For example, processing device may include one or more digital computers, such as laptops, desktops, workstations, personal digital assistants, servers, blade servers, mainframes, and other appropriate computers.

Processing device 59 is configured (e.g., programmed with instructions) to determine if power levels for the bursts correspond to expected power levels. For example, processing device 59 may store, or have access to, data specifying expected power levels for particular burst frequencies. The expected power levels may include an acceptable or expected range of power levels for a particular frequency or frequencies. The expected power levels need not be the same for each frequency across all ATE. Rather, each ATE may have its own expected power level(s) per frequency. Processing device 59 may obtain the expected power levels from the ATE itself or from storage associated with the ATE. The storage may be local to, or remote from, the ATE. For example, processing device may obtain the expected power levels from a Web site for the ATE. Alternatively, the expected power levels may be customer-specific and, therefore, may be provided by a customer who is scheduled to use the ATE for testing.

The power levels obtained by processing device 59 may be used to verify the performance of the ATE and to calibrate the ATE if the performance of the ATE is not acceptable. This is referred to as performance verification (PV). For example, if a power level of a burst frequency exceeds that which is expected, the ATE may be reprogrammed to reduce the power level of that burst frequency. Conversely, if the power level of a burst frequency is less than that which is expected, the ATE may be reprogrammed to increase the power level of that burst frequency. In this implementation, ATE 56 is programmed to generate a progression of bursts, which occur one after the other. The processing device processes the resulting series/sequence of bursts in order to obtain the power levels therefor. By generating a number of bursts and analyzing the bursts as they are generated, system 55 reduces the amount of time needed to calibrate the ATE. That is, the alternative, which is to generate individual bursts and calibrate following each individual burst, can be more time consuming than the process described herein.

Figure 4:
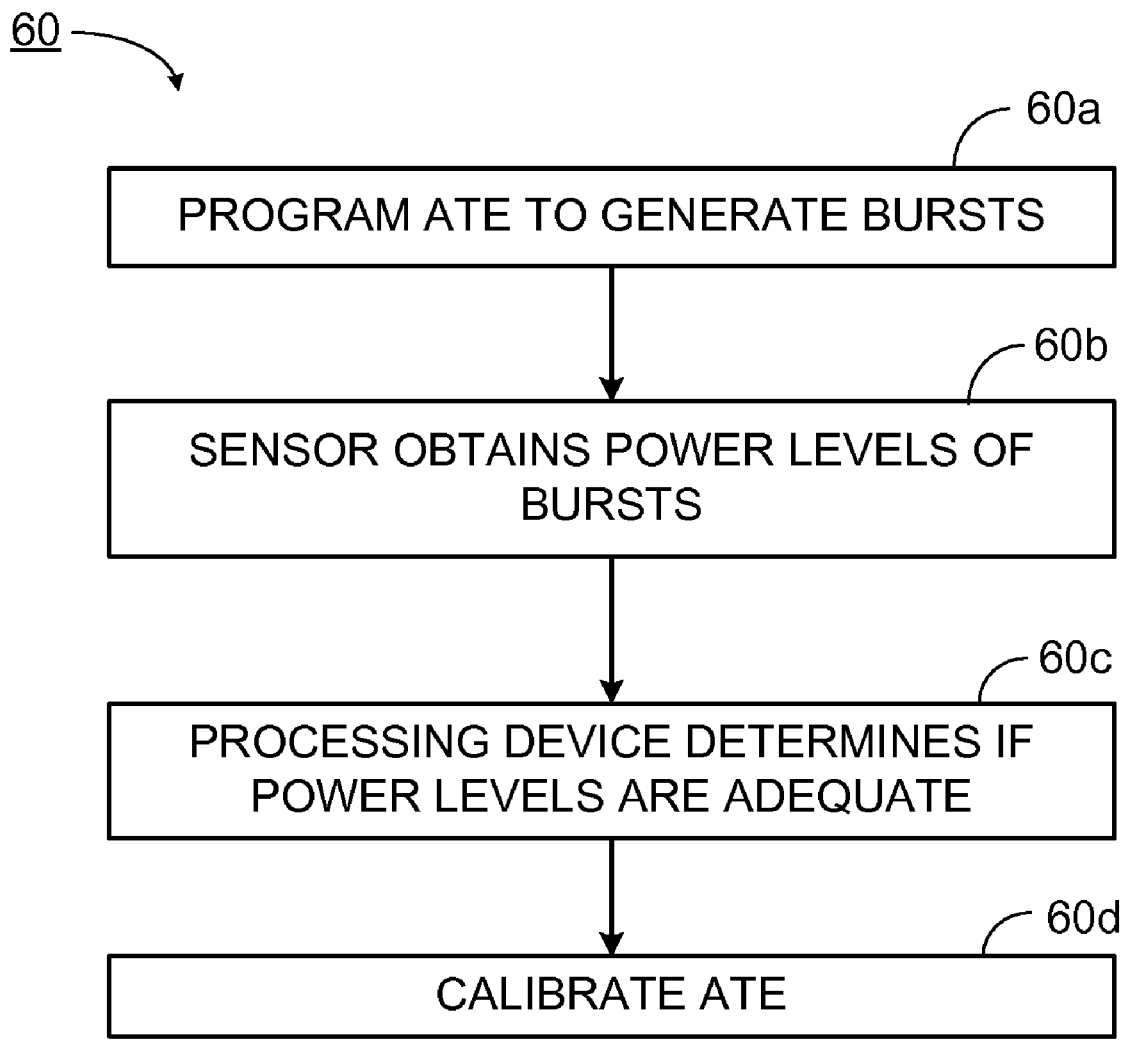
FIG. 4 is a flowchart showing a process for calibrating automatic test equipment.
Figure 5:
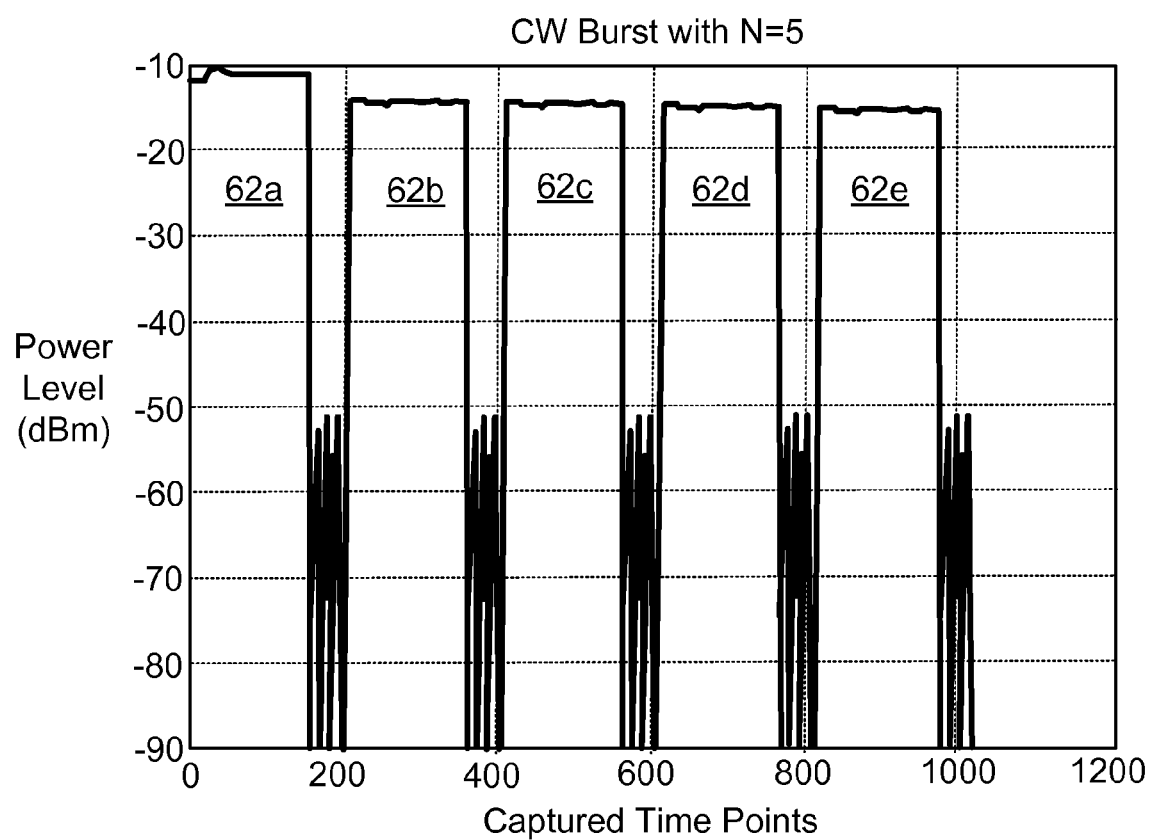
FIG. 5 is a graph showing bursts generated by the ATE.

In this regard, the following describes a process 60 for calibrating ATE 56 in the system of FIG. 3. Referring to FIG. 4, process 60 includes programming (60*a*) the ATE. In this implementation, the ATE is programmed by setting the PSETS, as explained above. The ATE is programmed to generate a progression of bursts—one after the other. Each burst is generated at a specified frequency. The progression may include a predefined amount of still or "dead" time between bursts. An example of a progression of bursts generated by the ATE is shown in FIG. 5. There, the bursts are labeled 62*a* to 62*e*.

In process 60, sensor 57 obtains (60*b*) a power level for each burst 62*a* to 62*e*. This may be done for all, or part, of the progression of bursts without performing additional processing after each power level is obtained. In this implementation, sensor 57 waits for a burst to substantially settle before the power level is obtained. For example, sensor 57 may be programmed, or computer-controlled, to wait a predetermined amount of time after each burst before measuring the burst's power level. Alternatively, sensor 57 may perform periodic or substantially continuous measurements of a burst, and obtain the power level after the amplitude of the burst settles to within a predetermined tolerance.

Processing device 59 receives the power levels for the bursts from sensor 57 and determines (60*c*) if the power levels correspond to expected power levels for the corresponding frequencies. As explained above, processing device 59 may be pre-programmed with the expected power levels or processing device 59 may obtain the expected power levels from some source, e.g., the ATE itself, a customer who has purchased the ATE, a Web site for the ATE, or the like.

To determine if the measured power level of a burst corresponds to its expected power level, processing device 59 may compare the measured power level to the expected power level. If the two match, or are within an acceptable tolerance of one another, processing device 59 may determine that the power level of the burst is acceptable. If the two do not match, or are not within an acceptable tolerance, processing device 59 may determine that the power level of the burst is not acceptable. Other types of processing may also be used to determine if the power level of a burst corresponds to its expected power level. For example, it may be determined if the power level is within one or more standard deviations of a predefined power level.

As indicated above, processing device 59 may process the bursts before performing any further actions with respect to the bursts, such as calibrating the ATE or reporting on power levels. For example, processing device 59 may receive each power level after it is obtained by sensor 57, and process that power level in order to determine if the power level corresponds to the expected power level. The corresponding frequency per power level may be obtained from sensor 57 or from another source, or the frequency may be pre-programmed into the processing device. Alternatively, processing device 59 may receive all power levels (or a subset thereof) at once, and then process those power levels in the manner described herein.

ATE 56 may be calibrated (60*d*) based on the information obtained from processing device 59, e.g., based on a determination of whether the obtained power level(s) correspond to the expected power level(s). By way of example, the ATE may be calibrated by adjusting circuitry and/or programming within the ATE that is configured to produce the bursts and/or cause the bursts to be produced. In this regard, the ATE may include a signal generator to generate the bursts, and calibration may be performed on circuitry and/or programming that affects the signal generator.

Calibration may be performed automatically (e.g., without substantial user intervention) by processing device 59. This is illustrated in FIG. 3 by the dashed line between processing device 59 and ATE 56. Calibration may involve one-way or two-way communication between processing device 59 and ATE 56. Alternatively, calibration may be interactive in that it may involve some degree of user participation. For example, it may involve a user initiating or instructing download of new programming to the ATE and/or physically adjusting settings on the ATE that affect the bursts.

Once the ATE has been calibrated, process 60 may be repeated as many times as is necessary in order to achieve the desired calibration.

Figure 6:
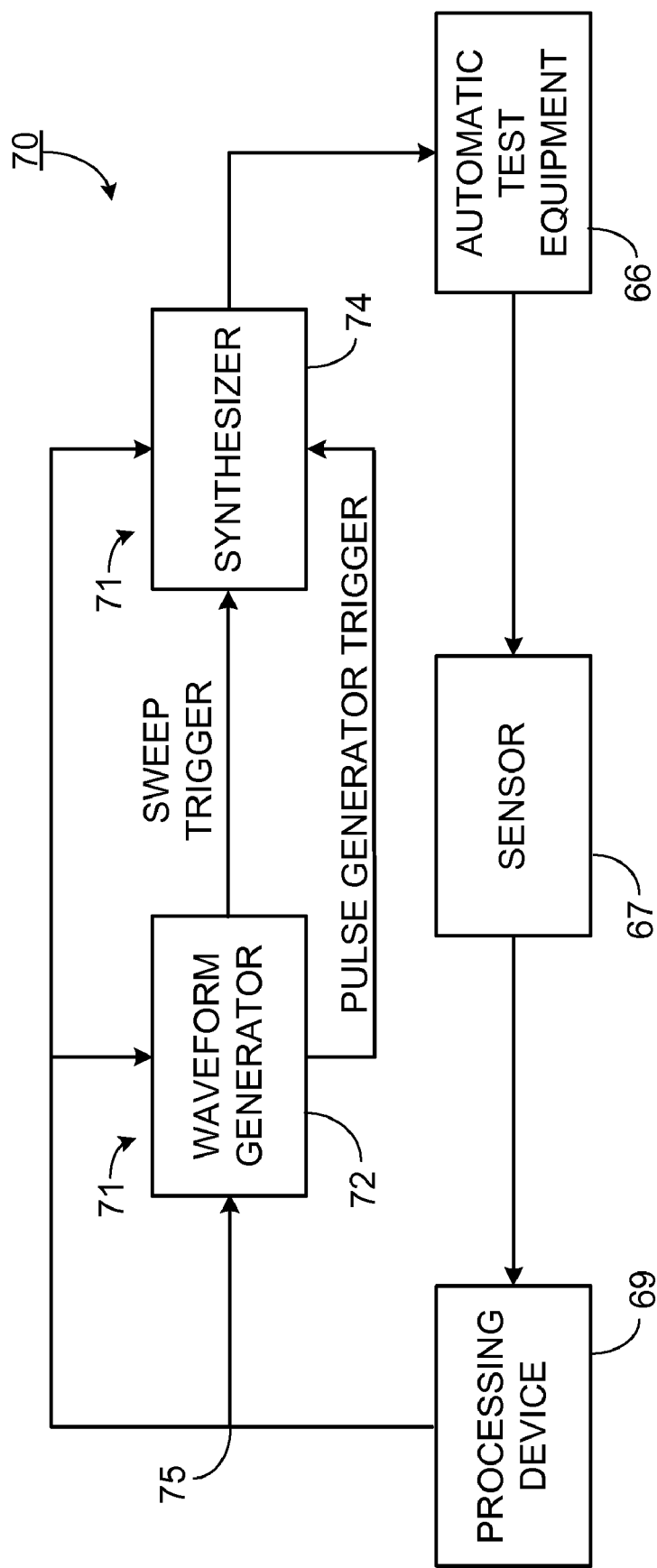
FIG. 6 is a block diagram showing an alternative configuration for calibrating automatic test equipment during a performance verification process.

FIG. 6 shows an alternative implementation of a system 70 for calibrating ATE. In FIG. 6, the ATE is programmed to generate bursts using control signals from external circuitry. Sensor 67 and processing device 69 may have substantially the same structure and function as described above with respect to FIG. 3.

ATE 66 (of system 70) may or may not include PSETS. However, it does include circuitry to receive control signals, to process the control signals, and to generate bursts having characteristics (e.g., frequency, amplitude, etc.) specified by the control signals. In this implementation, signal generation circuitry 71 includes a waveform generator 72 configured to generate pulses and a synthesizer 74 to modulate the pulses so that they convey information to ATE 66. For example, the information may specify the number of bursts to be generated, frequencies of the bursts, and power levels for the frequencies.

In the configuration of FIG. 6, burst are generated by turning the radio frequency (RF) on and off, and by starting and stopping each frequency sweep substantially simultaneously. This is achieved by supplying generator 72 and synthesizer 74 with the same trigger. In this example, triggering is initiated by processing device 69 via a general purpose interface bus 75 (GPIB). Generator 72, in this example an Agilent® 33250A automatic wave generator (AWG), receives the resulting trigger and, in response, sources five pulses with a 40 millisecond (ms) period and a duty cycle of 75%. Synthesizer 74, in one example is an Agilent® E8257D device, is configured to modulate the five pulses according to five frequencies and power levels that are sequenced once the appropriate trigger signal is received. Power sensor 67 is configured to capture power presented to its input and, in this implementation, to start doing so when an input signal level of 40 dBM is reached. In another example, synthesizer 74 includes an Agilent® E4438C vector signal generator. The circuitry may include additional equipment and techniques to enable measurement information to be condensed in a single event trigger.

ATE 66 receives the pulses from synthesizer 74, and generates bursts having characteristics (e.g., frequency, amplitude, power level) corresponding to the pulses received from synthesizer 74. An N (N>1) number of bursts are sourced—each at a different frequency. Power sensor 67 is triggered to capture any abrupt perturbation from RF (radio frequency) off to RF on. The resulting effect is a capture of sequenced time points that represents the power envelope of each frequency test point (see FIG. 2). The captured sequence of points is presented to processing device 69, where they are processed in the manner described above.

Figure 7:
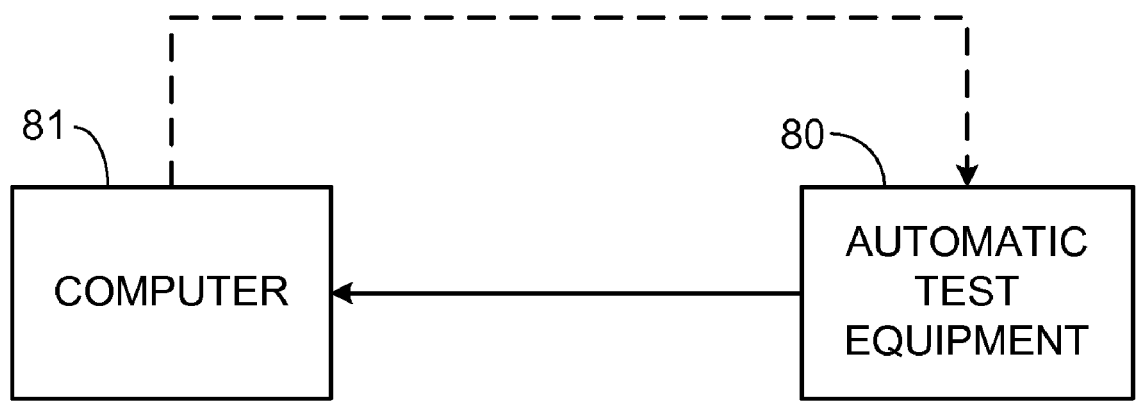
FIG. 7 is a block diagram showing an alternative configuration for calibrating automatic test equipment during a performance verification process.

FIG. 7 shows an example of an alternative configuration for calibrating ATE 80. In the configuration of FIG. 7, the sensor, and any other components required to generate bursts in succession, are part of the ATE. As such, the functionality performed by those components are performed within the ATE itself. For example, the ATE may be programmed via a processing device, such as a computer 81, to perform all or part of the functions described herein.

Process 60 described above, and any modifications thereto and related processes described herein (hereinafter "the processes"), are not limited to the hardware and software described above. All or part of the processes can be implemented, at least in part, via a computer program product, i.e., a computer program tangibly embodied in an information carrier, such as one or more machine-readable media or a propagated signal, for execution by, or to control the operation of, one or more data processing apparatus, e.g., a programmable processor, a computer, multiple computers, and/or programmable logic elements.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the processes can be performed by one or more programmable processors executing one or more computer programs to perform the functions of the calibration process. All or part of the processes can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

In the implementations described above, the processing device is configured to determine if power levels for the bursts correspond to expected power levels. In other implementations, the processing device may be configured (e.g., programmed with instructions) to determine if other signal characteristics are within expected ranges.

In the implementations described above, the processing device is a separate entity from the ATE. However, in other implementations, the processing device may be a part of the ATE. The same is true for the sensor.

In other implementations, the ATE may be programmed to generate signal bursts that are based on characteristics other than frequency. For example, the ATE may be programmed to generate signal bursts having specified periods or amplitudes. In this regard, the ATE may be programmed to generate signal bursts having plural predefined characteristics, e.g., frequency and amplitude. Power levels for these bursts may be measured, and the ATE calibrated, in the manner described above.

In other implementations, circuitry attributed herein to the ATE may be part of a DUT and/or other components that are electrically connected to the ATE. In this regard, electrical connection, when used herein, does not require a direct physical connection. An electrical connection may include intervening components between two components. Likewise, electrical connection may include non-wired electrical connections, such as those produced by a transformer.

The methods and apparatus described herein may be used during performance verification of all or part of the ATE, e.g., to verify operation of boards in a tester.

Elements of different embodiments described herein may be combined to form other embodiments not specifically set forth above. Other embodiments not specifically described herein are also within the scope of the following claims.

What is claimed is:

1. A method for use with automatic test equipment (ATE), comprising:
   programming the ATE to generate bursts, each of the bursts corresponding to a signal characteristic produced by the ATE;
   obtaining power levels for the bursts;
   determining if the power levels for the bursts correspond to expected power levels for signal characteristics corresponding to the bursts; and
   calibrating the ATE based on a determination of whether one or more of the power levels corresponds to one or more expected power levels;
   wherein the programming, obtaining, determining, and calibrating are performed without connecting a device to be tested to the ATE.

2. The method of claim 1, wherein each of the bursts corresponds to a different signal characteristic produced by the ATE.

3. The method of claim 1, wherein programming the ATE comprises:
   receiving data identifying signal characteristics; and
   using the data to cause the ATE to generate the bursts.

4. The method of claim 3, wherein using the data comprises adjusting programmable settings (PSETS) on the ATE.

5. The method of claim 1, wherein obtaining a power level for a subject burst comprises:
   waiting for the subject burst to substantially settle; and
   obtaining a power level of the subject burst after the subject burst substantially settles.

6. The method of claim 1, wherein calibrating the ATE comprises adjusting circuitry in the ATE that is configured to produce one or more bursts corresponding to the one or more power levels.

7. The method of claim 1, wherein the bursts comprises a progression of bursts that occur one burst after another burst.

8. The method of claim 1, wherein the signal characteristic comprises at least one of signal frequency and signal amplitude.

9. A system comprising:
   automatic test equipment (ATE) that is configured to generate bursts, each of the bursts corresponding to a signal characteristic that is producible by the ATE;
   a sensor configured to obtain power levels for the bursts; and
   a processing device configured to determine if the power levels for the bursts correspond to expected power levels for signal characteristics corresponding to the bursts, and to calibrate the ATE based on a determination of whether one or more of the power levels corresponds to one or more expected power levels;
   wherein the power levels are obtained and the ATE is calibrated without connecting a device to be tested to the ATE.

10. The system of claim 9, wherein each of the bursts corresponds to a different signal characteristic produced by the ATE.

11. The system of claim 9, wherein the ATE is configured to:
    receive data identifying signal characteristics; and
    use the data to cause the ATE to generate the bursts.

12. The system of claim 11, wherein the processing device comprises a computer; and
    wherein the ATE comprises a signal generator configured to generate the bursts based on the data.

13. The system of claim 11, wherein using the data comprises adjusting programmable settings (PSETS) on the ATE.

14. The system of claim 9, wherein obtaining a power level for a subject burst comprises:
    waiting for the subject burst to substantially settle; and
    obtaining an average power level of the subject burst after the subject burst substantially settles.

15. The system of claim 9, wherein the bursts comprises a progression of bursts that occur one burst after another burst.

16. The system of claim 9, wherein the signal characteristic comprises at least one of signal frequency and signal amplitude.

17. A system comprising:
    signal generation circuitry configured to provide information to a device, the information corresponding to signal characteristics;
    the device configured to receive the information and to generate bursts based on the information;
    a sensor configured to obtain power levels for the bursts; and
    a processing device configured to determine if the power levels for the bursts correspond to expected power levels for signal characteristics corresponding to the bursts, and to calibrate the device based on a determination of whether one or more of the power levels corresponds to one or more expected power levels;
    wherein the power levels are obtained and the device is calibrated without connecting a device to be tested to the device configured to generate the bursts.

18. The system of claim 17, wherein the signal generation circuitry comprises:
    a waveform generator configured to generate pulses; and
    a synthesizer to affect the pulses so that the pulses convey the information to the device.

19. The system of claim 17, wherein the information comprises at least one of signal frequency and signal amplitude.

* * * * *